US007342465B2

(12) United States Patent
Seefeldt

(10) Patent No.: US 7,342,465 B2

(45) Date of Patent: Mar. 11, 2008

(54) VOLTAGE-CONTROLLED OSCILLATOR WITH STABLE GAIN OVER A WIDE FREQUENCY RANGE

(75) Inventor: James D. Seefeldt, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 28 days.

(21) Appl. No.: 11/254,466

(22) Filed: Oct. 20, 2005

(65) Prior Publication Data

US 2007/0090890 A1 Apr. 26, 2007

(51) Int. Cl.
*H03L 7/00* (2006.01)
*H03L 7/099* (2006.01)
*H03B 5/12* (2006.01)

(52) U.S. Cl. ........................... 331/185; 331/2; 331/17; 331/34; 331/48; 331/49; 331/177 R; 331/186

(58) Field of Classification Search .................... 331/2, 331/8, 17, 18, 25, 34, 1 A, 48, 49, 57, 177 R, 331/179, 185, 186; 327/156, 157
See application file for complete search history.

(56) References Cited

U.S. PATENT DOCUMENTS 4,479,091 A 10/1984 Yoshisato
6,256,362 B1 7/2001 Goldman
6,441,691 B1 8/2002 Jones et al.
6,583,675 B2 * 6/2003 Gomez ........................ 331/17
6,683,930 B1 1/2004 Dalmia
6,710,670 B2 3/2004 Maneatis
6,806,786 B1 * 10/2004 Lam et al. .................. 331/179
6,856,202 B2 2/2005 Lesso
7,129,800 B2 * 10/2006 Gauthier et al. ............ 331/175

OTHER PUBLICATIONS

U.S. Appl. No. 11/254,474, filed Oct. 20, 2005, James D. Seefeldt.
U.S. Appl. No. 11/254,569, filed Oct. 20, 2005, James D. Seefeldt, et al.
U.S. Appl. No. 11/254,473, filed Oct. 20, 2005, James D. Seefeldt.
U.S. Appl. No. 11/254,466, filed Oct. 20, 2005, James D. Seefeldt.
Dong Pan, et al, "A Radiation-Hard Phase-Locked Loop," IEEE 2003, pp. 1-6.

* cited by examiner

*Primary Examiner*—Robert Pascal
*Assistant Examiner*—Ryan J Johnson
(74) *Attorney, Agent, or Firm*—McDonnell Boehnen Hulbert & Berghoff LLP

(57) ABSTRACT

An apparatus and method for providing a stable gain over wide frequency range in a VCO are presented. A VCO uses a waveform generator along with a bias generator having a frequency select input. The frequency select input is used to adjust the amount of output current and/or gain of the bias generator. The output current of the bias generator determines the frequency of the output of the waveform generator. Multiple bias and waveform generators may be used to expand the frequency range of the VCO. A PLL may be programmed for a variety of output frequencies by using the frequency select input of the VCO.

20 Claims, 8 Drawing Sheets

37
VCO BIAS GENERATOR 40a
VCO WAVEFORM GENERATOR 42a
Voltage/ Current Source 39
50a 50b 50c 50d 44a
26a 26b 51a 51b
VCO BIAS GENERATOR 40b
VCO WAVEFORM GENERATOR 42b
50e 50f 50g 50h 44b 52a
51c 51d
VCO BIAS GENERATOR 40c
VCO WAVEFORM GENERATOR 42c
50i 50j 50k 50l 44c 52b 52c
51e 51f
MUX 54
34
f 43
FREQUENCY DIVIDER 53

84d
84c
84b
84a
82
98d
97d
98c
97c
98b
97b
98a
97a
IREF 50d
IREF 50c
IREF 50b
IREF 50a
90
88
40a $V_p$
$V_n$
$f_1$ 51a
$f_2$ 51b
94b
94a
96
95
92b
92a
86
26b
26a
44a

| Frequency Select (MHz) | 51a | 51b | 51c | 51d | 51e | 51f | (Gain MHz/V) |
|---|---|---|---|---|---|---|---|
| 1008.8 - 1234.6 | 1 | 1 | 1 | 1 | 0 | 1 | 225.8 |
| 830.1 - 1043.6 | 1 | 1 | 0 | 1 | 1 | 1 | 213.5 |
| 624.8 - 842.1 | 0 | 1 | 1 | 1 | 1 | 1 | 217.3 |
| 431.1 - 649.2 | 1 | 1 | 1 | 1 | 1 | 0 | 218.1 |
| 229.8 - 432.7 | 1 | 1 | 1 | 0 | 1 | 1 | 202.9 |
| 34.8 - 235.3 | 1 | 0 | 1 | 1 | 1 | 1 | 200.5 |

VOLTAGE-CONTROLLED OSCILLATOR WITH STABLE GAIN OVER A WIDE FREQUENCY RANGE

GOVERNMENT RIGHTS

The United States Government has acquired certain rights in this invention pursuant to Contract No. DTRA01-03-D-0018 and Delivery No. DTRA01-03-D-0018-0001 awarded by the Defense Threat Reduction Agency.

FIELD

The present invention relates generally to a voltage controlled oscillator, and more particularly, a voltage controlled oscillator that provides a stable gain over a wide frequency range.

BACKGROUND

Phase locked loops ("PLL") have been used extensively in analog electrical systems and communication systems. In today's high performance systems operating within increasingly stringent timing constraints, PLLs are being introduced in more general digital electronic circuits. For example, application specific integrated circuits ("ASIC") used in a variety of circuit applications typically include on-chip PLLs for clock signal distribution.

The key advantages that PLLs bring to clock distribution are phase/delay compensation, frequency multiplication and duty cycle correction. A PLL enables one periodic signal or clock signal to be phase-aligned to frequency multiples of a reference clock signal. As the name implies, the output of the PLL locks onto the incoming reference clock signal and generates a periodic output signal with a frequency substantially equal to the average frequency of the reference clock. When the output PLL signal tracks the reference signal, the PLL is said to be "locked."

A PLL, however, will only remain locked over a limited frequency range or shift in frequency called a hold-in or lock range. The PLL generally tracks the reference signal over the lock range, provided the reference frequency changes slowly. If the frequency changes at too fast of a rate, the PLL will drop out of lock. The maximum rate of change of the reference frequency (without loosing lock) is known as the "locked sweep rate."

PLLs are typically designed for a specific frequency range. A voltage controlled oscillator (VCO) along with a charge pump are used to create a waveform output. The frequency of the waveform output is directly dependent on the circuit components within the voltage controlled oscillator and/or charge pump. These circuit components often include gain elements such as a differential amplifier. The gain of a differential amplifier (or other gain elements) is limited to a specific voltage range. When a voltage is applied to a differential amplifier that is outside of its normal operating range, the gain of the differential amplifier may become too reduced to be useful. Addtionally, operating outside of the differential amplifier's normal voltage range may lead to instability in the operation of the differential amplifier. This instability may the result in operational instability in an associated VCO and/or PLL.

Because differential amplifiers and related circuitry are limited to a specific voltage range, the useful output range of a corresponding VCO is likewise limited to a specific frequency range and the frequency range of a PLL in which such a VCO is implemented is accordingly limited to the specific frequency range of the VCO. For example, FIG. 1*a* illustrates frequency output vs. input voltage for a VCO (exerpt from "A Low-Noise, 900-MHz VCO in 0.6 μm CMOS", IEEE Journal of Solid State Electronics, May 1999, p 586-191). In this example, the normal operating gain is 300 MHz/V in an input voltage range of 1.4-1.8V. Input voltages in the range of 1-1.3 V may have a gain of 450 MHz/V. Higher input voltages, for example, 2.2-2.4 V, may produce a reduced gain of 200MHz/V. Because the stability of a PLL is directly related to the gain of the PLL, it is important to consider the gain of the PLL for a given output frequency of the VCO. If the gain varies, the stability of the PLL may therefore vary.

It is desirable for a PLL to have a wide frequency range. Some advantages of a wide frequency range include a large spectrum of output frequencies and ease of integration into various components and/or devices. A large spectrum of output frequencies allows a single PLL to produce a desired waveform for an application that may use a broad range of frequencies. If a PLL has a narrow bandwidth, however, two or more PLLs may be required in a specific application. For semiconductor devices, adding on chip PLLs increases the area of a chip, power consumption, and static current, which is undesirable.

PLLs with large bandwidths are desirable because such PLLs may be provided as standard parts or standard design cells. For instance, instead of providing mulitiple PLLs in a design library, a single large bandwidth PLL may be provided. Such a PLL may then be combined with other circuits without the overhead of designing a specific PLL for each specific application.

Conventional methods of increasing the bandwith of a PLL include adding dividers to the PLL feedback path and adjusting current to the charge pump feeding the VCO. While adding dividers in the PLL feedback loop does increase the output frequency of the PLL, as discussed above, the gain of the PLL will vary depending on the output frequency range. This variation in gain of the PLL presents integration issues when covering a wide frequency range. Additionally, instability of the PLL may also result from such variation in gain.

Adjusting the current output of a charge pump, as disclosed in U.S. Pat. No. 6,710,670 (Maneatis), may also provide for improving an operating frequency range of a PLL. In Maneatis, a feedback path from a bias generator is used to adjust the amount of current output from the charge pump. However, several complications arise in this method. Integration of the charge pump requires a more complicated loop filter (for impedence matching). Also, when the PLL is operated over a large frequency range, inadvertant noise created by the charge pump may occur. Overall, the more complicated loop filter makes fabricating the PLL more difficult. In addition, adjusting the PLL over a wide frequency range is also more complicated.

PLLs including a VCO that has a stable gain over a wide frequency range, however, would provide more flexibility in the design and integration of such PLLs with other circuits. Therefore, there is a need for an improved VCO that has a stable gain over a wide frequency range.

SUMMARY

An apparatus and a method of operation of a voltage controlled oscillator are presented.

In one embodiment, a voltage controlled oscillator uses a bias generator and a waveform generator to produce an output waveform. The bias generator produces an output bias that is determined by a frequency input. The waveform generator uses the output bias to create a waveform with a frequency corresponding to the frequency input.

In a second embodiment, a voltage controlled oscillator uses a plurality of bias generators and waveform generators along with a logic circuit to expand the frequency range of operation of the voltage controlled oscillator. The frequency input may also be divided into several signals.

In a third embodiment, bias generators may be provided a bias from a bias source. The bias source may produce several different bias voltages and/or currents that correspond to various frequencies.

In a fourth embodiment, a bias generator comprises a differential amplifier and a reference circuit. The differential amplifier has an adjustable gain. In a further embodiment, the reference circuit may comprise one or more transistors to provide a plurality of currents to a waveform generator.

In a fifth embodiment, a bias generator may comprise a logic circuit that determines the gain of a differential amplifier as well as the output current of the reference circuit. The logic circuit may also be used to turn the bias generator on and off.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Certain example embodiments are described below in conjunction with the appended drawing figures, wherein like reference numerals refer to like elements in the various figures, and wherein.

DETAILED DESCRIPTION

Example voltage controlled oscillators (VCOs) having stable gain over a wide frequency range are presented. One such VCO includes a bias generator and a waveform generator to produce a PLL output signal. The VCO receives a frequency input signal that is used to select an output frequency range and/or adjust the sensitivity of the VCO. The bias generator receives the frequency input signal and produces an output signal. The waveform generator uses the output signal from the bias generator to create a waveform with a frequency corresponding to the frequency input signal. The frequency input signal may be communicated to a differential amplifier and/or reference circuits within the bias generator.

The VCO may also be designed to include a plurality of bias and waveform generators in order to provide an increased output frequency range. A logic circuit, such as a multiplexer, coupled to the waveform generators may be used to select an appropriate output waveform. The frequency input signal may also be used to turn the bias and waveform generators on and off if they are not being used. In addition, the frequency input signal may be divided into multiple signals. The divided signals may be distributed to various bias generators within the VCO.

Figure 1A:
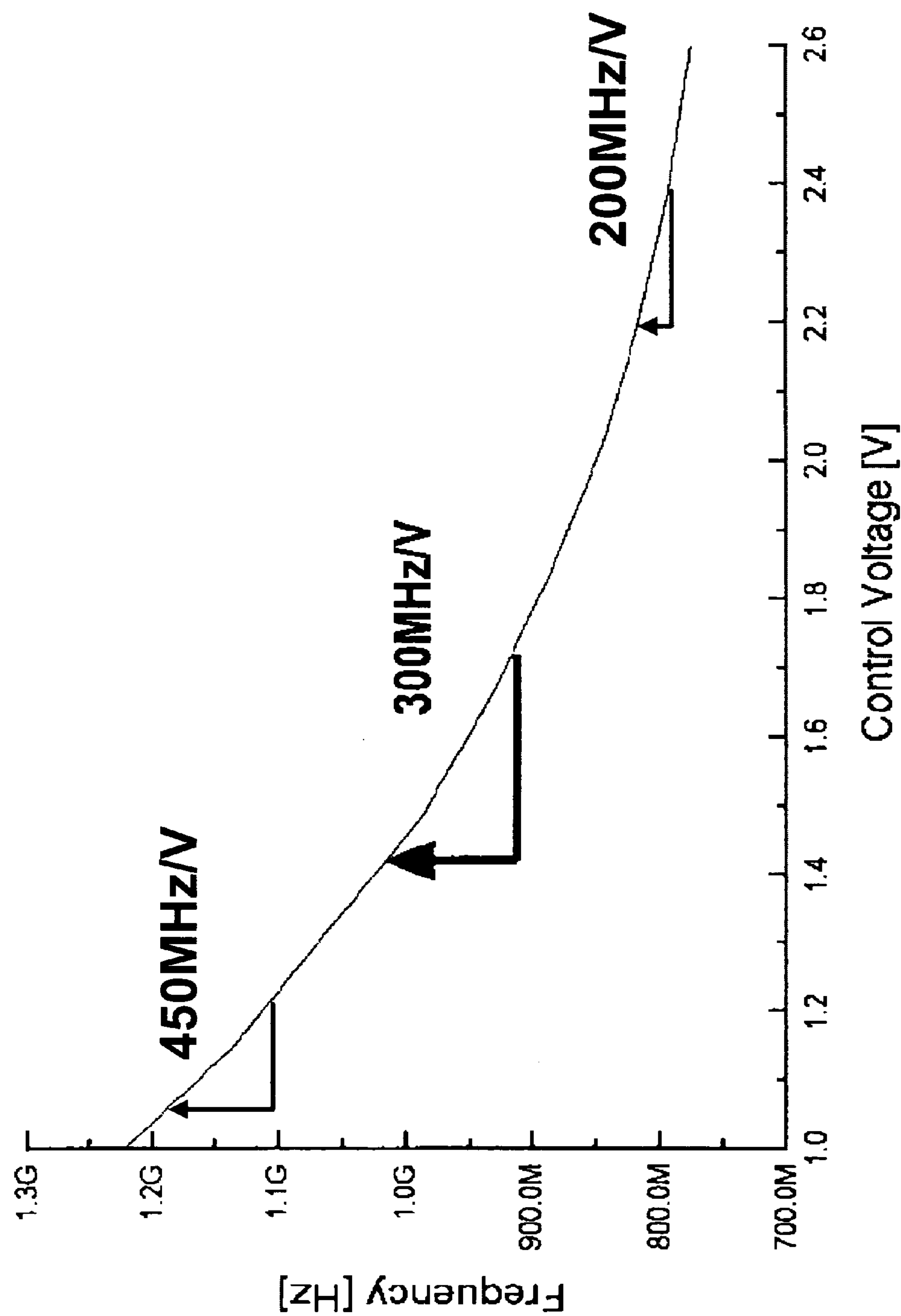
FIG. 1*a* is a graph illustrating a change in gain with increasing voltage.
Figure 1B:
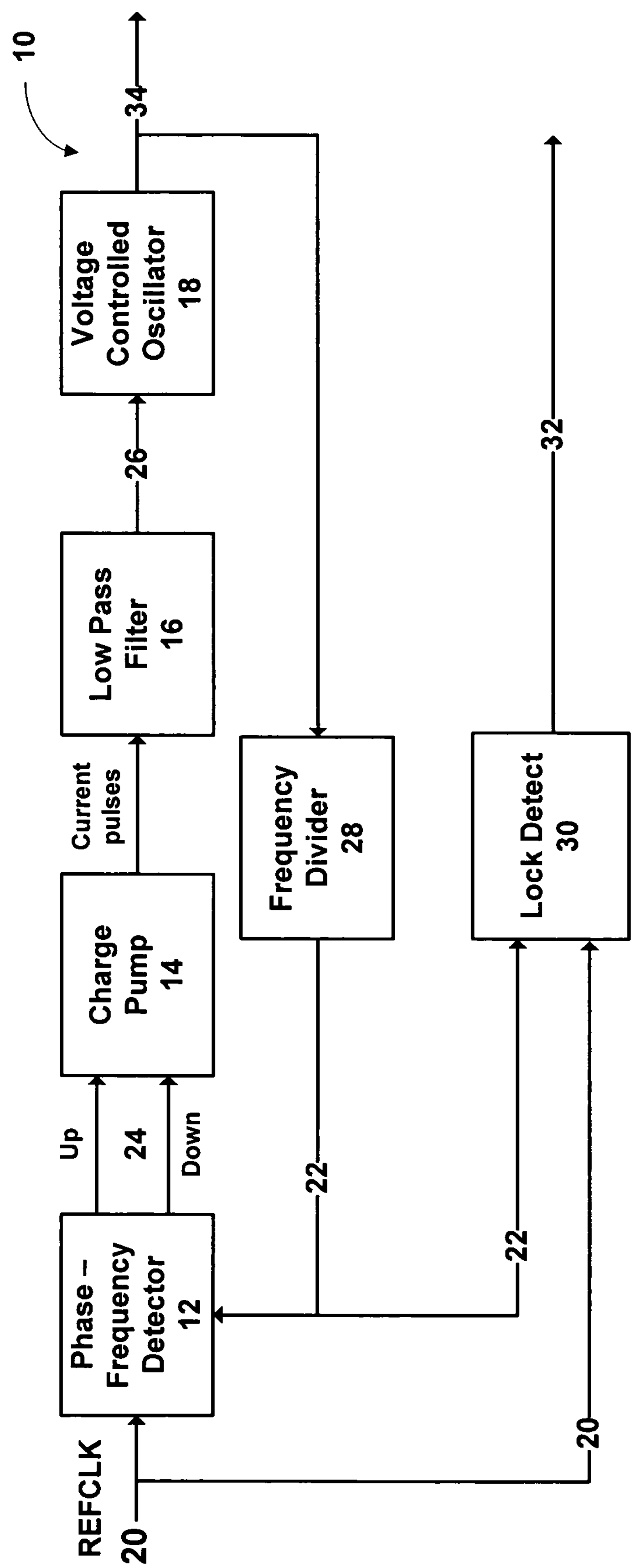
FIG. 1*b* is a block diagram of a phase locked loop.

Turning now to FIG. 1*b*, an example PLL 10 is shown that includes a phase-frequency detector 12, a charge pump 14, a loop (low pass) filter 16, a VCO 18 and a lock detector 30. The phase-frequency detector 12 receives a reference clock signal via a signal line 20 and a derived (or feedback) clock signal via a signal line 22. The output signal of the phase-frequency detector 12 is communicated to the charge pump 14. An output signal from the charge pump 14 is communicated to the loop filter 16. The loop filter 16 is coupled with the VCO 18. The VCO 18's output signal is communicated to a frequency divider 28. An output signal of the frequency divider 28 is communicated back to the phase-frequency detector 12 and it also provided to the conventional lock detector 30. The lock detector 30 is also supplied the reference clock signal via a signal line 20 to enable it to provide the conventional lock detect signal 32.

In operation, the phase detector 12 compares two input frequencies, generating an output signal that is a measure of their phase difference. For instance, the phase-frequency detector 12 compares the input reference clock signal (REFCLK) with the feedback clock signal (FBKCLK) and generates an error signal that is communicate via a signal line 24. The error signal is proportional to the magnitude of the phase/frequency difference between the two signals. For purpose of illustration, the output signal of the phase detector 12 is shown as up or down pulses communicated on signal lines 24. These pulses would typically be communicated to a counter (not shown), which acts as the loop filter 16, e.g., to drive the VCO 18. In another embodiment, the phase detector 12 may output an n-bit phase error signal that may be provided to a standard digital filter (also not shown).

The error signal is communicated to the charge pump 14 to reduce the loading of the phase detector 12 of the PLL 10 circuitry. The charge pump 14's output current signal controls the magnitude of the charge stored in the loop filter 16, thus converting the phase-frequency detector 12's output signals to a control voltage input signal for the VCO 18, which is communicated via the signal line 26. The VCO 18 generates an output signal with a frequency that is proportional to the control voltage signal.

When the PLL 10 is locked, there is a constant phase difference (usually zero) between the REFCLK and FBKCLK signals and their frequencies are matched. If the two signals are substantially equal, their output signal from the phase detector 12 will have an amplitude of approximately zero. If the signals differ, the phase detector 12 outputs a corresponding voltage signal on the signal line 24. In operation, the phase detector 12 compares the REFCLK signal with the oscillator output signal (using the frequency divider 28) to generate the periodic feedback clock (FBKCLK) output signal that tracks the REFCLK signal. If the FBKCLK signal from the oscillator falls behind the REFCLK signal in frequency, the phase detector 12 causes the charge pump 14 to change the control voltage, so that the oscillator 18 speeds up. Likewise, if the FBKCLK signal creeps ahead of the REFCLK signal, the phase detector 12 causes the charge pump 14 to change the control voltage to slow down the oscillator 18. The loop (low pass) filter 16 smooths out the abrupt control inputs from the charge pump 14, so that the system tends towards a state where the phase detector 12 makes very few corrections. The result is a stable PLL output signal on signal line 34, which can be used in a variety of applications. One such application may be a clock generation circuit implemented on an integrated circuit.

There are many circumstances, however, when the PLL 10 will not be able to produce a stable output signal. The lock detect 30 indicates when a stable output is or is not being ouput by measuring the REFCLK and the FBKCLK signals. If there is not a stable output, lock detect 30 will produce a signal on the signal line 32 that corresponds to a "lock" condition not being met. When the PLL 10 loses lock, it is not desirable to use the output signal of the PLL 10 because it may not be stable. The frequency range of the PLL 10 is therefore limited by the stability of the PLL 10 at the lowest and highest frequencies that allow the PLL 10 to be locked.

Because many applications require a wide frequency range, it is desirable to supply a PLL with a VCO that has a wide frequency range and stable gain. The stable gain will prevent the instability which may causes inadvertent output signal deviations and loss of lock.

Figure 2A:
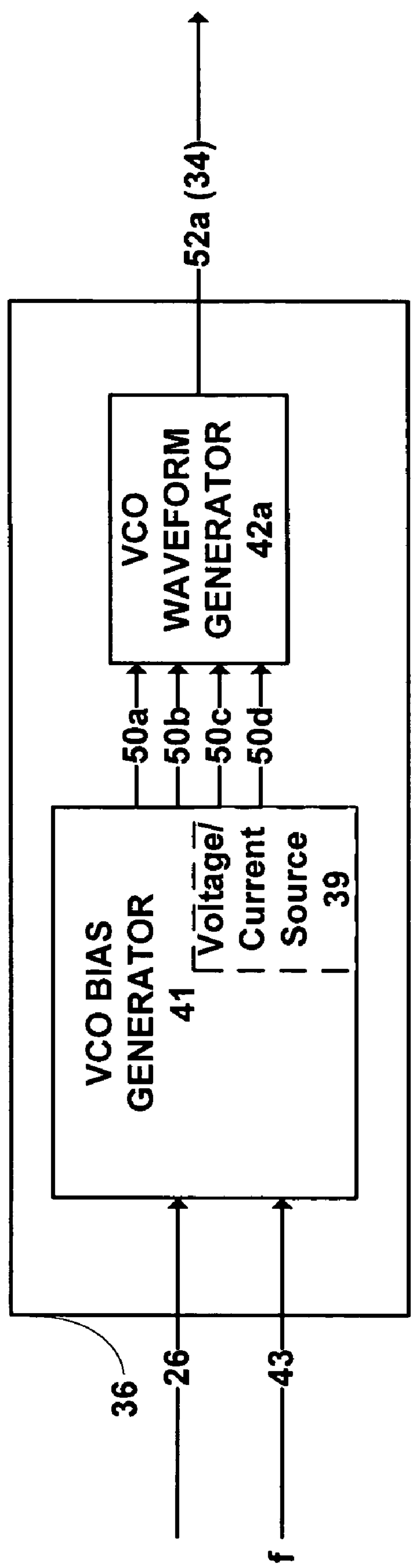
FIG. 2*a* is a block diagram of a voltage controlled oscillator (VCO)

An example VCO 36 with such frequency range and stable gain is illustrated in FIG. 2*a*. The VCO 36 comprises a VCO Bias Generator 41, an embodiment of which is described in further detail with reference to FIG. 4. The VCO 36 also includes a VCO Waveform Generator 42*a*, an embodiment of which is described in further detail with reference to FIGS. 3*a-b*. The VCO 36 receives a voltage control signal (e.g., from a loop filter and/or charge pump) via the signal line 26 and a frequency select signal via a signal line 43. The VCO 36 produces a waveform generator output signal that is communicated via the signal line 52*a*. In certain embodiments, the signal communicated on the signal line 52*a* is a PLL output signal. Further, in certain embodiments, the voltage control signal may be implemented as a current control signal.

The VCO 36 includes bias generator 41 that, in turn, includes a voltage/current source 39. The voltage/current source 39 ("V/C Source") is used to provide a reference bias to the bias generator 41. An embodiment of the V/C Source 39 is further described with reference to FIG. 5.

Upon receiving the frequency select signal and the voltage control signal, the bias generator 41 outputs reference current ("IREF") signals via the signal lines 50*a-d*. The IREF signals are communicated to waveform generator 42*a*, which outputs a waveform output signal, which as described above, may be a PLL output signal). The frequency select signal and the voltage control signal are used to determine the amount of current being supplied by the IREF signals. For example, the frequency select signal may be a voltage signal that indicates a frequency range of 50-250 MHz. The voltage control signal may indicate that a higher output signal frequency is required to match the REFCLK signal. The amount of current output in the IREF signal may reflect these two input conditions.

The frequency select signal may also establish how sensitive the bias generator 41 is to the voltage control signal. For instance, at higher output signal frequencies, the waveform generator 42*a* may be more sensitive to slight changes in the IREF signals. In this example, a higher frequency select signal amplitude may decrease the corresponding change in the IREF signals with changes in the control voltage signal. It will be appreciated that the frequency select signal may be an analog signal; or, in other embodiments it may be a digital signal.

Figure 2B:
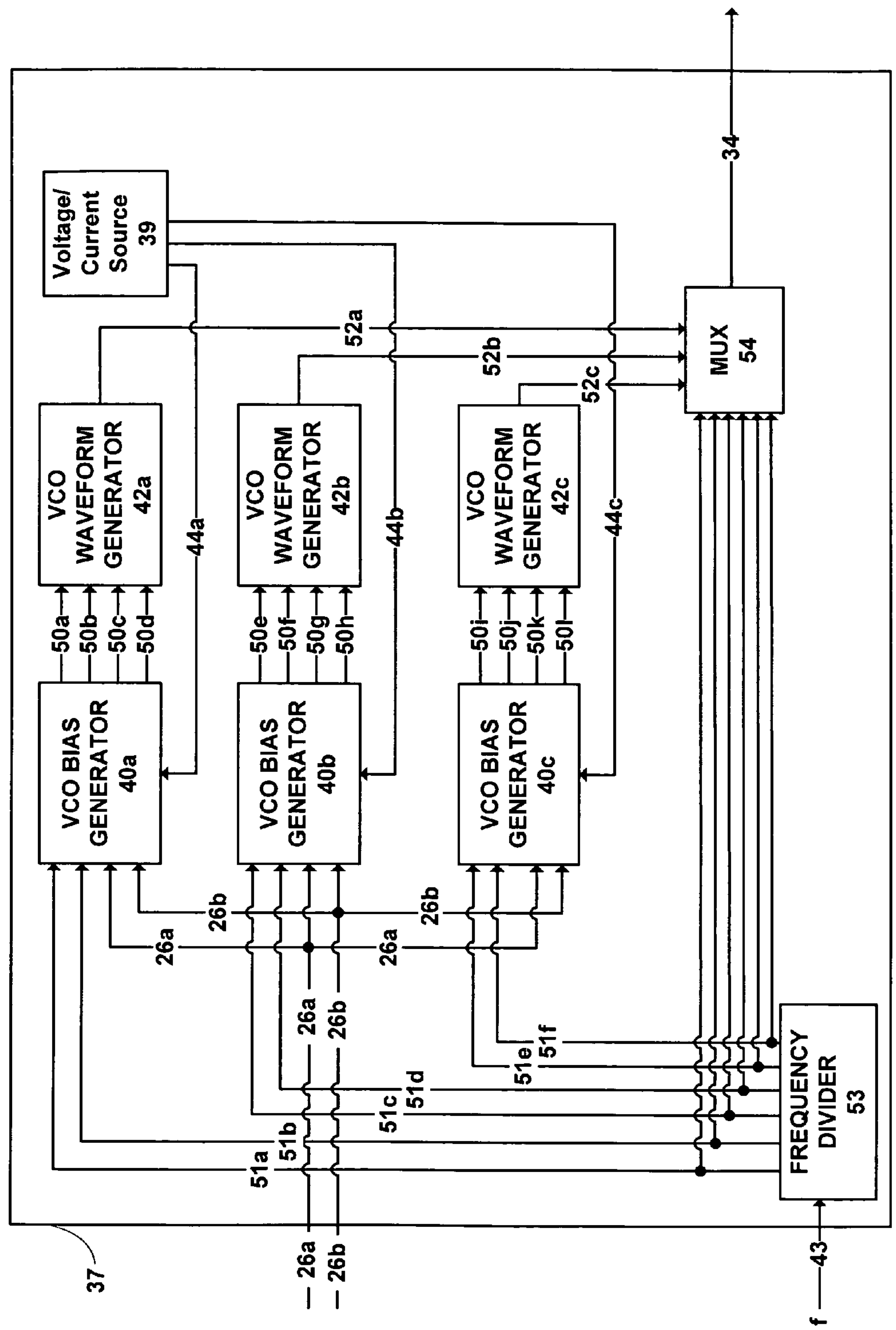
FIG. 2*b* is a block diagram of another VCO.

FIG. 2*b* illustrates another embodiment of a VCO 37. The VCO 37 includes multiple bias generators 40*a-c* and waveform generators 42*a-c*. The bias generators 40*a-c* each receive a differential voltage control signal via signal lines 26*a*, 26*b*. While the voltage control signal in the VCO 37 is a differential signal; alternatively the signal may implemented as a single-ended signal, such as was described with reference to FIG. 2*a*. The bias generators 40*a-c* of the VCO 37 receive a plurality of discrete frequency select signals via the signal lines 51*a-f*. A frequency divider 53 is used to convert a frequency select signal into the discrete frequency select signals communicated on the signal lines 51*a-f*. The bias generators 40*a-c* generate IREF output signals that are communicated on signal lines 50*a-l*.

The waveform generators 42*a-c* receive the IREF signals and generate corresponding output waveform signals that are communicated on signal lines 52*a-c*. The ouput waveform signals are communicated to a multiplexer 54. The multiplexer 54 receives the discrete frequency select signals via the signal lines 51*a-f*. A PLL output signal is then generated by the multiplexer 54 and is communicated on the signal line 34. In other embodiments, the multiplexer 54 may directly receive the frequency select signal. It is noted that for this embodiment, the multiplexer 54 indirectly uses the frequency select signal (e.g., the discrete frequency select signals) to generate the PLL output signal. The multiplexer 54 may also include a different logic circuit arrangement to generate the PLL output signal.

The discrete frequency select signals (communicated via the signal lines 51*a-f*) may also be used to turn on/off any of the bias generators 40*a-c*. For example, if both frequency select inputs are "high", a given bias generator may be off and its associated wavefrom generator will not output a waveform signal. This approach may reduce the overall power consumption of a VCO and in turn a PLL by turning off power consuming circuits within the waveform generators that are not being used.

As shown in FIG. 2*b*, the bias generators 40*a-c* are coupled with V/C Source 39 to receive individual reference biases via signal lines 44*a-c*. Because the differential amplifer and reference circuits within bias generators 40*a-c* may be designed for a specific frequency range, the V/C Source 39 may produce a distinct bias level for each bias generator.

Figure 3A:
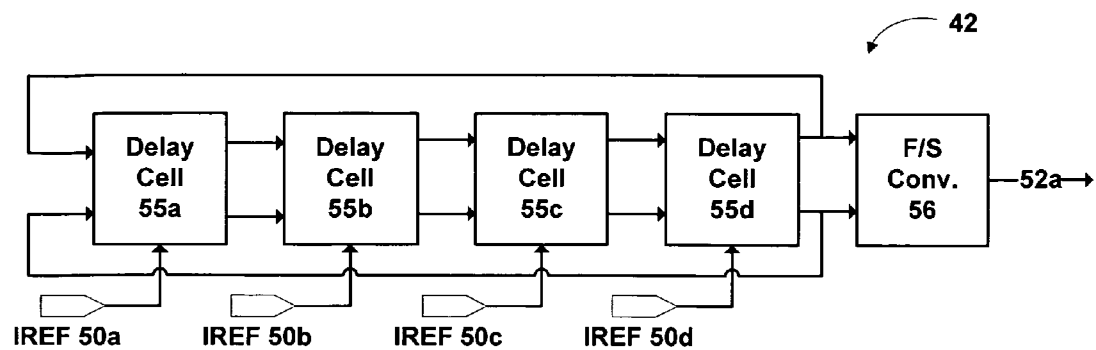
FIG. 3*a* is a block diagram of a VCO waveform generator.

FIG. 3*a* is a block diagram that illustrates an embodiment of the waveform generator 42*a* shown in FIG. 2*b*. The waveform generator 42*a* comprises delay cells 55*a-d* and a full-swing to single-ended conversion ("F/S") circuit 56. It will be appreciated that the structure of waveform generators 42*b*, 42*c* may be similar to the waveform generator 42*a* or, alternatively, may be different in structure. In the waveform generator 42*a*, delay cells 55*a-d* respectively receive IREF signals via the signal lines 50*a-d*. The delay cells 55*a-d* also receive differential input signals and output an amplified differential output.

As shown in FIG. 3*a*, the differenial output terminals of the delay cell 55*d* are coupled to the input terminals of the delay cell 55*a* in addition to being coupled to the input terminals of the F/S circuit 56. The F/S circuit 56 converts the full-swing differential signal recevied from the delay cell 55*d* to a single-ended, logic level, output signal that is communiated via the signal line 52*a*. In embodiments where a full-swing differential output signal is desired for the waveform generator 42*a*, the F/S circuit 56 may be omitted. In other embodiments of a waveform generator, additional or fewer delay cells may be used. The frequency, stability, and power consumption of VCOs, such as the VCOs 36, 37, are dependent on the number of delay cells used. The impact of adding or subtracting delay cells will now be discussed in detail with reference to FIG. 3*b*.

Figure 3B:
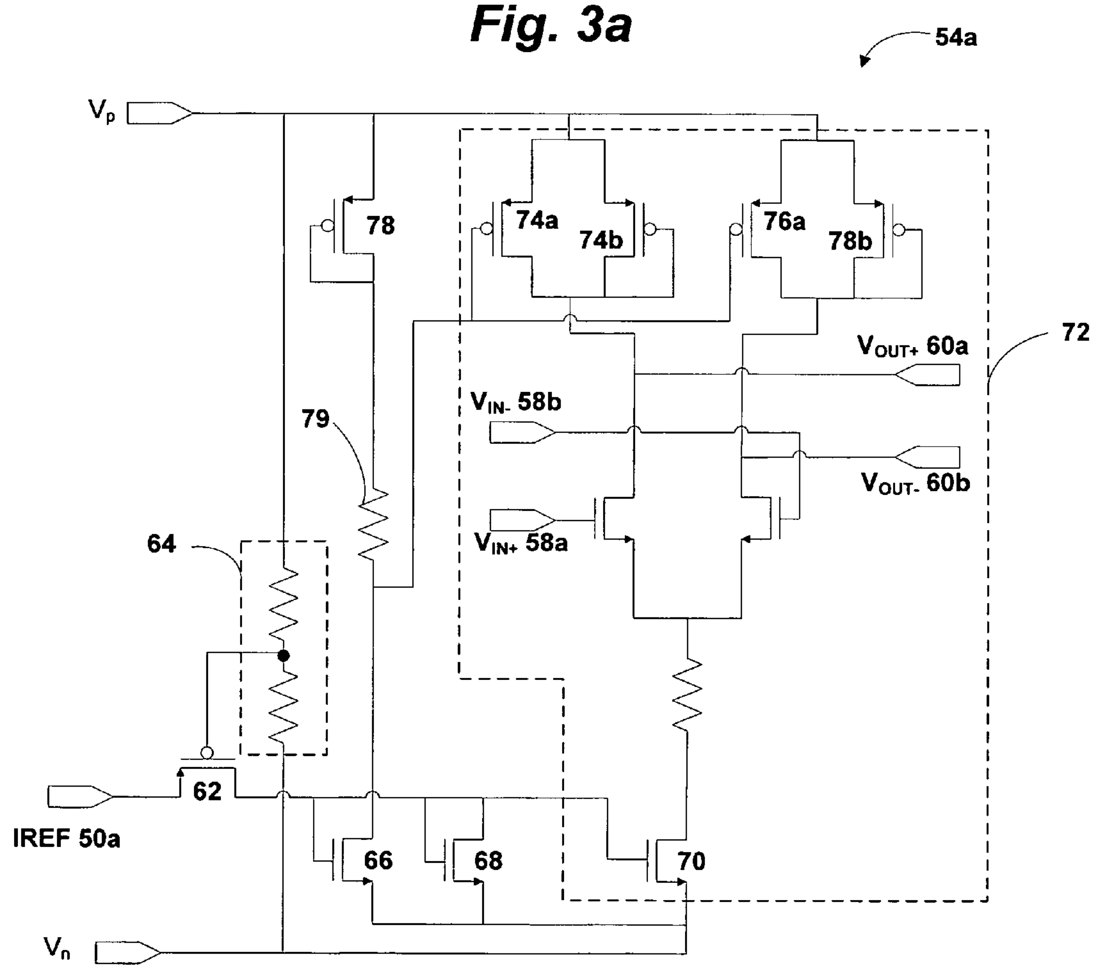
FIG. 3*b* is a circuit diagram of a delay cell.

A circuit schematic representation of the delay cell 55*a* is illustrated in FIG. 3*b*. It will be appreciated that the structure of the delay cells 55*b-d* may be similar to the delay cell 55*a* or, alternatiely, may be implemented in one or more other configurations. An IREF signal (via the signal line 50*a*) and differential input signals $V_{IN+}$ and $V_{IN-}$ (via signal lines 58*a*, 58*b*) are input into the delay cell 55*a*. In response to these signals differential output signals $V_{OUT+}$ and $V_{OUT-}$ (via signal lines 60*a*, 60*b*) are output from the delay cell 55*a*. Within the delay cell 55*a*, the IREF signal is communicated to a PMOS transistor 62. The PMOS transistor 62 has a bias applied to its gate which is determined by a voltage divider 64, the source voltages of NMOS transistors 66, 68 and the gate voltage of an NMOS transistor 70. The NMOS transistor 70 is used as a current source within a differential amplifier 72. In this embodiment, the differential amplifier 72 includes an active load formed by PMOS transistors 74*a*, 74*b*, 76*a*, 76*b*. Also coupled to the gates of the active load PMOS transistors 74*a* and 76*a* is an output terminal of a PMOS transistor 78. PMOS transistor 78 is used to adjust the amount of current through active load PMOS transistors 74*a* and 76*a*.

In operation, the IREF signal communicated via the signal line 50*a* determines the biasing of the NMOS transistors 66, 68, 70. The higher the current value of the IREF signal, the higher the gate-source biasing on transistors 66, 68 and 70. The opposite correlation exists for decreasing current values of the IREF signal. If the gate-source biasing of the transistor 70 increases, more current will be supplied to the tail end of differential amplifier 72.

When a differential voltage is applied to the differential amplifier 72, the signal applied at the $V_{IN+}$ and $V_{IN-}$ signal terminals 58*a*, 58*b* is amplified and inverted at $V_{OUT+}$ and $V_{OUT-}$ 60*a*, 60*b*. This is represented by the equation:

$$(V_{OUT+}-V_{OUT-})=A_V(V_{IN+}-V_{IN-})$$

The transition time, or delay time ("τ"), of the amplification is proportional to the amount of current applied to the tail end of the differential amplifier 72. Essentially, the more current supplied to the differential amplifier 72, the slower the latching (i.e., transition from "high" to "low" or "low" to "high" output signals) within the differential amplifier 72. Therefore, when the current through transistor 70 increases, the delay time τ increases. Also, when the current through transistor 70 decreases, it is easier for the differential amplifier 72 to invert signals and the delay time τ correspondingly decreases. Because the transistor 70 is directly influenced by the IREF signal, varying the current magnitude of the IREF signal provides for direct control of the delay time τ.

The delay time τ may also be adjusted using the transistor 78. For instance, the transistor 78, along with a resistor 79, is used to bias the active load transistors 74*a*, 76*a*. The transistors 78, 74*a* and 76*a* operate so as to compensate for delay times in the active load transistors 74*a*, 74*b* and 76*a*, 76*b*. To achieve this compensation, the transistors 74*a* and 76*a* turn on early before a transition from "high" to "low" or "low" to "high" takes place. The extra current supplied by these transistors reduces the delay time τ by reducing the amount of time it takes the active load to transition. Since the IREF signal directly controls the amount of current through transistor 66, varying the current of the IREF signal also affects the delay time τ by adjusting the active load of the differential amplifier 72.

In the above embodiment shown in FIG. 3*a*, in operation, the feedback loop of delay cells 55*a-d* converges to produce a steady state waveform. Initially, a small perturbation in differential input will be subsequently amplified until a threshold of amplification is reached. The inverted differential output of delay cells 55*a-d* will produce an oscillating waveform that has a leading edge that will be delayed by delay time r in each individual delay cell. A leading edge will cycle through delay cells 55*a-d* two times before returning to its original voltage level. The overall frequency of the VCOs 36, 37 is therefore calculated as:

$$f=\frac{1}{2N\tau}$$

where N is the number of delay cells. As discussed above, fewer delay cells may be used and a faster frequency output will be realized. However, using fewer delay cells may result in a corresponding reduction in stability of the VCO. Noise and other interference (such as electromagnetic interference) may cause this instability by creating unwanted deviations in frequency or phase shift.

Conversely, adding delay cells may increase circuit stability, but may also result in an increase in power consumption and a decrease in frequency. These considerations will need to be taken into account by a circuit designer in choosing the appropriate tolerances of a given VCO. One advantage of the above embodiment of the delay cell 54*a*, in which four delay cells are used, is that a 90 degree phase shift takes place between each delay cell. This type of phase shift configuration may be advantageous for determining output frequency poles.

From the above description, it will be appreciated that the IREF signals communicated via the signal lines 50*a-d* to the waveform generator 42*a* have a significant impact on the output frequency of a VCO in which such a circuit is incorporated. For instance, changing the current values of the IREF signals causes a change in delay time τ and in turn directly impacts the output frequency of a corresponding, such as the VCOs 36, 37.

Figure 4:
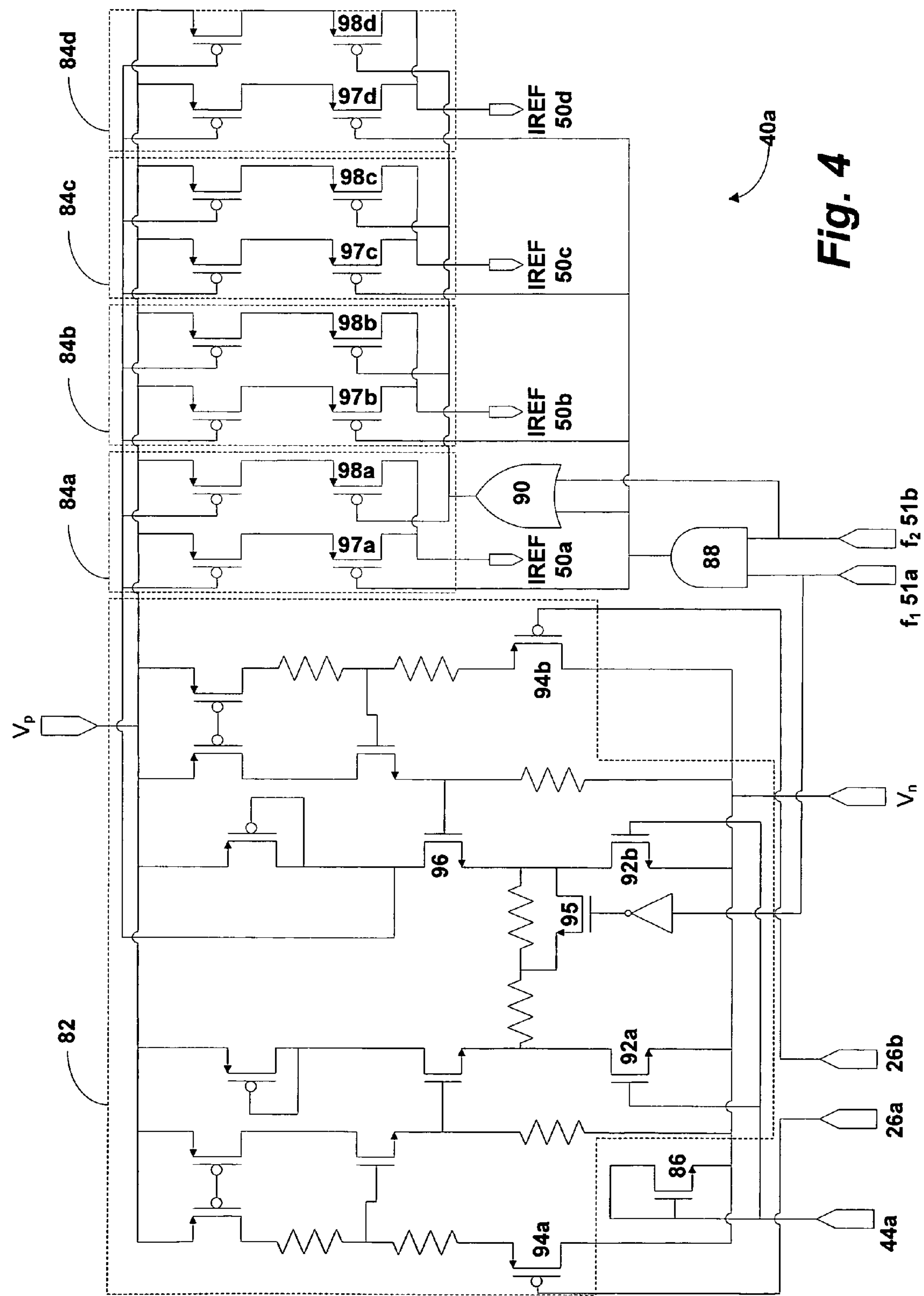
FIG. 4 is a circuit diagram of a VCO bias generator.

A circuit schematic illustrating an embodiment of the bias generator 40*a* is shown in FIG. 4. FIG. 4 illustrates how the IREF signals discussed above are generated and how a selectable frequency is achieved. In the bias generator 40*a*, a reference current signal, a reference bias signal (via signal line 44*a*), and voltage control signals (via the signal lines 26*a*, 26*b*) are input to the bias generator 40*a*. Additionally, frequency select signals $f_1$, $f_2$ are input to the bias generator 40*a* via the signal lines 51*a*, 51*b*, respectively. In other embodiments, additional or fewer frequency select signals may be used.

Within the VCO bias generator 40*a* is differential amplifier 82, current mirrors 84*a-d*, NMOS transistor 86, AND gate 88 and OR gate 90. The reference bias signal, in this particular embodiment is a power supply compensated current and is used to bias transistors 92*a*, 92*b* within the differential amplifier 82. In similar fashion to the differential amplifier 72 in FIG. 3, the transistors 92*a*, 92*b* serve as a tail current source. The voltage control signals (communicated via the signal lines 26*a*, 26*b*) bias PMOS transistors 94*a*, 94*b*. A transistor 96 provides a voltage at its drain that is mirrored to the gates of the PMOS transistors within current mirrors 84*a-d*. The gain may be increased by turning transistor 95 "on" or "off" with the frequency select signal $f_1$ 51*a*. The gain adjustment of the differential amplifier 82 changes the sensitivity of the IREF signals to changes in the voltage control signals.

Along with receiving an output signal from the PMOS transistor 96, the current mirrors 84*a-d* also receive a logic signal output from the AND gate 88, which is the logical AND of the frequency select signals fi and $f_2$ along with a logical OR (using the OR gate 88) of the output signal of the AND gate 88 and the frequency select signal $f_2$. The output of the AND gate 88 and the OR gate 90 are used to drive separate PMOS transistors 97*a-d* and 98 *a-d* within the current mirrors 84*a-d*. The IREF signals are output from the drains of PMOS transistors 97*a-d* and 98*a-d*. The summation of output currents from transistors 97*a-d* and 98 *a-d* allows the VCOs 36, 37 discussed above (or other VCOs employing such techniques) to have varying frequency ranges.

In operation, when a VCO, such as the VCOs 36, 37, reaches a steady state (e.g., when the REFCLK signal and the FBKCLK signal are matched), the voltage control signals (communicated via the signal lines 26*a*, 26*b*) will remain relatively stable. Before such a VCO reaches a steady state, the differential control signals will adjust the output current of the IREF signals (either up or down) until the frequency of the REFCLK signal and the FBKCLK signal are matched. However, positive or negative deviations in the frequencies of the REFCLK signal and the FBKCLK signal will also translate to an increasing or decreasing differential voltage. Again, increasing or decreasing the current of the IREF signals will result in a corresponding, respective increase or decrease in the delay time $\tau$, which is inversely proportional to the output frequency. As was described above with respect to FIG. 3*b*, the differential amplifier 82 is used to control the current of the IREF signals.

Because power supply variation can cause an undesirable output, particularly in amplification, the reference bias signal (communicated via the signal line 44*a*) controls the amount of current through the current source within the differential amplifier 82. The voltage at the gate of the NMOS transistor 86, which is determined by the reference bias signal, is applied to the gates of the transistors 92*a*, 92*b*. It is noted that the reference bias signal is negatively proportional to absolute temperature. That is, when the operating temperature increases, the reference bias signal will decrease and the current through the current source (transistors 92*a*, 92*b*) in the differential amplifier 82 will also decrease. If the reference bias signal were not negatively proportional to absolute temperature, the differential amplifier 82 would increase in gain as temperature increases. Increasing the gain would erroneously increase the output frequency of an associated PLL. The generation of the reference bias signal is further described below with respect to FIG. 5.

As was noted above, another influence on the gain of the differential amplifier 82 is the operation of the transistor 95. If the frequency select signal $f_1$ is "high" (e.g., frequency $f_1$ is selected), the transistor 95 will turn off. In this situation, the gain of the differential amplifier 82 will be reduced as the resistance from the drain of the transistor 92*a* to the drain of transistor the 92*b* has been increased. The ability to adjust the gain of the differential amplifier 82 affects the sensitivity of the output of the bias generator 40*a*. If the gain is low, the differential amplifier 82 will not increase its output voltage (at the drain of transistor 96) as significantly as if the gain is high. In other embodiments the frequency select signal $f_1$ could be used in an analog manner. For instance, the gate of the transistor 95 could have its biases adjusted so as to vary the gain of differential amplifier 82. In lieu of the transistor 95, a variable resistor could also be used to adjust the gain in an analog manner. The differential amplifier 82 may also have additional frequency select inputs.

The bias generator 40*a* may also be designed to select the amount of current to the IREF signals using frequency select input signals $f_1$, $f_2$. Upon receiving increasing or decreasing voltage control signals (via the signal lines 26*a*, 26*b*), the voltage at the drain of the transistor 96 will either increase or decrease. Increasing the drain voltage will decrease the current through the current mirrors 84*a-d* and vice versa.

In other embodiments, as well as the embodiments discussed above, the current mirrors 84*a-d* may be adjustable so as to select the amount of output current with the frequency select input signals. For example, in FIG. 4, the frequency select signals $f_1$, $f_2$ undergo logical operations before being applied to gates of the PMOS transistors 97*a-d*, 98*a-d*. If the frequency select signal f, is selected (by a logic "high", for example), the output of the AND gate 88 and the OR gate 90 will be "low" and the PMOS transistors 97*a-d*, 98*a-d* will be on. However, if the frequency select signal $f_2$ is selected, the output of the gate AND 88 will remain "low" and the output of the OR gate 90 will go "high". In this instance, only PMOS transistors 97*a-d* will be on, which will result in lower currents for the IREF signals. Therefore, a lower delay time $\tau$ will result and the output frequency will be higher. In such an embodiment, if both frequency selects $f_1$, $f_2$ are selected, the bias generator 40*a* would be turned off as transistors 97*a-d* and 98*a-d* will be turned off by the output of the gate AND 88 and the OR gate 90. Turning the bias generator 40*a* off will cause waveform generator 42*a* to also be turned off. Of course, there are many alternative embodiments of the logic that may be applied to the frequency select input signals. Particularly if additional frequency select input signals are available.

If, however, only one output frequency is desired, a single frequency input signal or, alternatively, no frequency input signals may be used. In other embodiments, the logical operations provided by the AND gate 88 and the OR gate 90 could be removed and only one set of transistors (e.g., 97*a-d* or 98*a-d*) could be used. A constant bias could be applied to either set of transistors. Also, the gain adjustment via the transistor 95 could be eliminated in other embodiments.

As described above, additional or fewer IREF signals may be used depending on the number of delay cells within a VCO, such as the VCOs 36, 37. In the bias generator 40*a*, the current mirrors 84*a-d* are used in lieu of current dividers. Current mirrors provide a determinable amount of current output that is not limited to intrinsic resistances, or to variations due to processing that may cause subtle differences in currents that could result from such current dividers. However, if stable current outputs are available from a current divider, alternative embodiments may employ such current dividers to generate the IREF signals.

Figure 5:
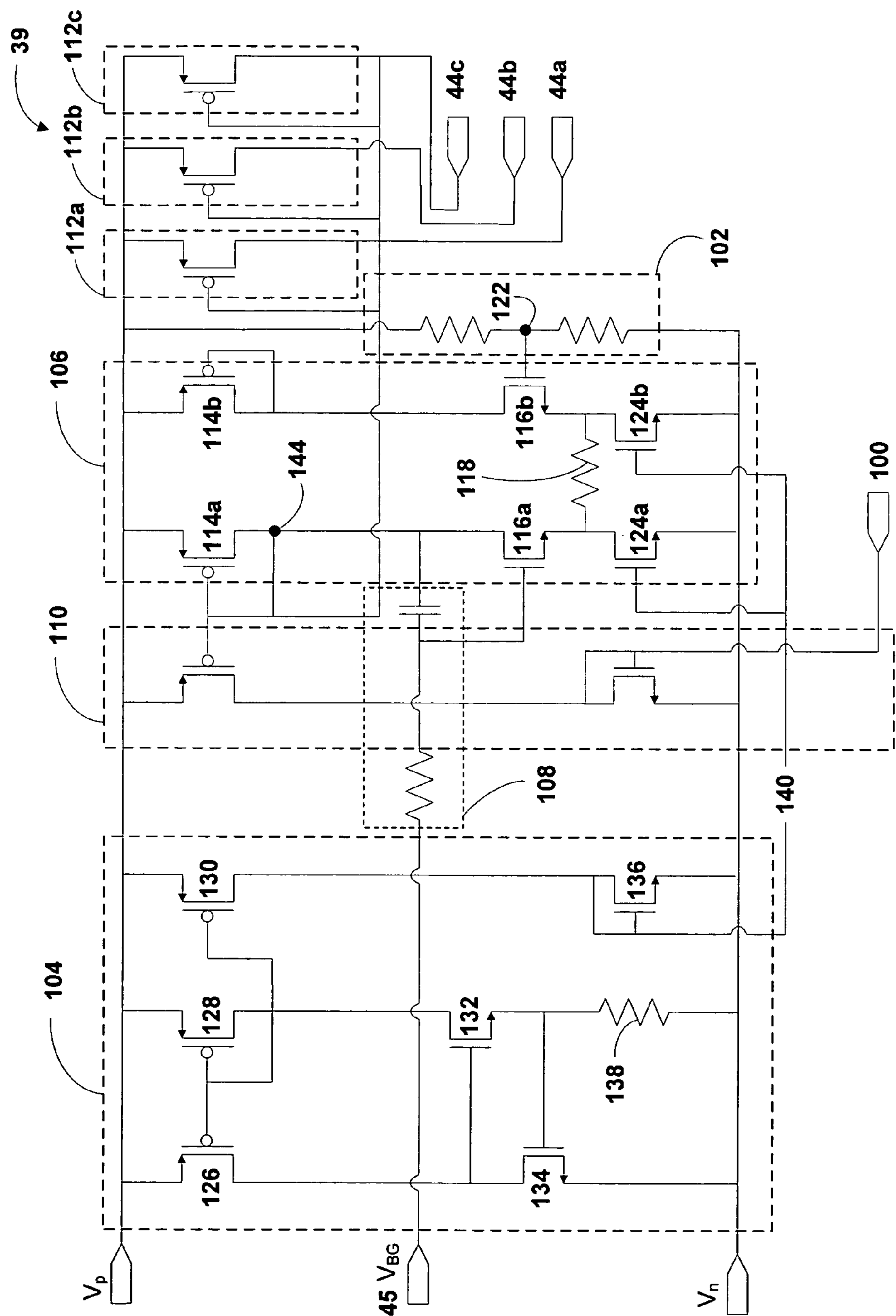
FIG. 5 is a circuit diagram of a voltage and current source.

The overall power supply variation independence of the VCOs 36, 37 may be dependent upon the reference bias signal (e.g., communicated via the signal line 44*a*). If the reference bias signal were to vary with power supply variation, the amount of current through the differential amplifier 82 would inadvertently increase or decrease. FIG. 5 illustrates a circuit embodiment of the V/C SOURCE 39 with power supply compensation. In other embodiments, the V/C SOURCE 39 may be integrated into a bias generator, as is shown in FIG. 2*a* with the bias generator 41 and the V/C SOURCE 39 included in the VCO 36.

In FIG. 5, voltage reference signal ($V_{BG}$) is input to the V/C source 39 via signal line 45. In this embodiment ($V_{BG}$) is a bandgap voltage reference signal, in other embodiments a different voltage reference signal may be used. Power supply compensated reference bias signals (which are presented on signal lines 44*a-c*) are generated by the V/C source 39 based on $V_{BG}$. In this embodiment, the compensated reference bias signals are current references. In other embodiments they may be voltage references.

The V/C SOURCE 39 includes a voltage divider 102, a voltage reference circuit 104, and a differential amplifier 106. The V/C source 39 also includes a filter 108, a voltage mirror circuit 110, and current mirror circuits 112*a-c*. Additional current mirror circuits may be used for additional bias and waveform generators. For instance, each current mirror may provide a reference current that corresponds to an individual bias generator.

The differential amplifier 106 includes PMOS transistors 114*a*, 114*b* (which form an active load), NMOS transistors 116*a*, 116*b*, a resistor 118, and NMOS transistors 124*a*, 124*b*. The sources of the active load PMOS transistors 114*a*, 114*b* are connected to a power supply. The drains of the transistors 114*a*, 114*b* are connected to the drains of the transistors 116*a*, 116*b*. The gate of the transistor 116*a* is biased by $V_{BG}$ (which is filtered by a filter 108) and the gate of the transistor 116*b* is biased by a node 120 within a voltage divider 122. The resistor 118 couples the sources of the transistors 116*a*, 116*b*. Also connected to the sources of the transistors 116*a*, 116*b* are the sources of the transistors 124*a*, 124*b*. The transistors 124*a*, 124*b* form a current supply.

As described above, the gate of transistor 116*a* is biased by $V_{BG}$. Biasing the transistor 116*a* with $V_{BG}$ allows the gate of the transistor 116*b* to be compared to a constant voltage reference within the differential amplifier 106. The gate of the transistor 116*b*, on the other hand, is biased by a node 122 within a voltage divider 102. The voltage divider 102 includes two series connected resistors. The power supply to common voltage ($V_p$–$V_n$) is distributed across the series connected resistors. When the power supply varies, the bias applied to the gate of the transistor 116 from the node 122 will also vary. This variation will be a scaled version of the power supply variation that is dependent on the values of the resistors of the resistor divider 102.

The sources of both the transistors 116*a*, 116*b* are connected to the drains of the transistors 124*a*, 124*b*, respectively. The gates of the transistors 124*a*, 124*b* are biased by a voltage reference circuit 104. The voltage reference circuit 104 includes transistors 126-136 and a resistor 138. The reference circuit 104 uses a threshold referenced current source to produce an output signal at the transistor 132 that is negatively proportional to absolute temperature.

In the voltage reference circuit 104, an input current travels through the transistors 126 and 134. The transistors 128 and 132 produce an output current. Because the gate of the transistor 132 is connected to the drain of the transistor 134, the output current through the transistors 128 and 132 will have more of a dependence on threshold voltage than on the input current through the transistors 126 and 134. Therefore, the effects of power supply variation on the output current through the transistors 126 and 134 will be dampened. The output current at the transistor 132 is mirrored and a voltage signal is generated on a signal line 140 and used to bias the transistors 124*a*, 124*b*. This voltage signal will be negatively proportional to absolute temperature.

If the temperature increases, the voltage of the voltage signal on the signal line 140 will decrease and the current through transistors 124*a*, 124*b* will decrease. Further, the current through the transistors 116*b* and 116*a* will also decrease, as will the reference bias signals communicated on the signal lines 44*a-c*. When the temperature decreases, however, the opposite effect is observed. That is, the voltage signal on the signal line 140, the current through the transistors 116*a*, 116*b* and the reference bias signals will increase. The amount of negative proportionality with absolute temperature may be determined by the particular design of the V/C Source 39.

Power supply variation compensation is illustrated by the following examples. It will be appreciated that if no variation in power supply occurs, the voltage at the drain of the transistor 116*a* (node 144) will remain constant. The voltage mirror circuit 110 may be used to generate a voltage on the signal terminal/line 100 and the current mirror circuits 112*a-c* may be used to create reference bias signals that are presented on the signal lines 44*a-c*.

If the power supply voltage increases (e.g., $V_p$–$V_n$), the bias applied to the gate of the transistor 116*b* will increase and the current through the transistor 116*b* will also increase. Because the transistor 116*a* has a reference voltage derived bias, the increase in current through the transistor 116*b* will be larger than the current through the transistor 116*a*. Basically, the voltage at the node 122 in the resistor divider 102 will be compared to the gate voltage at the transistor 116*a* (e.g., a filtered representation of $V_{BG}$). The current through the transistors 124*a*, 124*b* also increases with increased power supply voltage. A compensating current from the transistor 116*b* will travel through the resistor 118 to compensate for the increase in current through the transistors 124*a*, 124*b*. The compensating current will prevent a large increase in current in the transistor 116*a*. Therefore, the change in voltage and current at the node 144 will be dampened. If the power supply voltage decreases, the gate voltage applied to the transistor 116*b* will decrease. The compensating current will travel the opposite direction across the resistor 118. Again, the overall effect at the node 144 will be dampening of voltage changes by compensating currents traveling across the resistor 118.

Referring again to FIG. 2*b*, an example of the overall operation of the VCO 37 may be as described as follows. The VCO 37 may be designed to provide frequencies in the range of 50-1250 MHz, for example. Each of the bias generators 40*a-c* may correspond to intervals of the overall frequency range. For instance, the bias generator 40*a* may have a range corresponding to 50-250 MHz and 650-850 MHz, which is selectable by its frequency select inputs. Similarly the ranges of the bias generators 40*b*, 40*c* may be 250-450 MHz, 850-1050 MHz and 450-650 MHz, 1050-1250 MHz respectively. A frequency select input signal (communicated on the signal line 43) may indicate that a frequency range of 250-450 MHz is desired. A 6-bit binary signal will be produced by the frequency divider 53 where the field of the binary signal is communicated via the signal lines 51*a*, 51*b*, 51*c*, 51*d*, 51*e* and 51*f*. In this example, the binary signal generated may be: (1, 1, 1, 0, 1, 1). This particular binary signal would result in the bias generators 40*a*, 40*c* being off and indicated that a frequency range corresponding with the frequency select signal communicated via the signal line 51*c* is selected. The differential amplifier 82 within the bias generator 40*b* would then have a reduced gain and the PMOS transistors 97*a-d* and 98*a-d* would all be on. The IREF signals communicated on the signal lines 50*e-h* determine the delay time τ of the waveform generator 42*b*. A waveform indicative of the delay time τ is output at output via the signal line 52*b*. The waveform is communicated to the MUX 54. The MUX 54 also receives the 6-bit binary signal and selects the signal on the signal line 52*b* as the PLL output signal, which is communicated via the signal line 34.

If a different frequency range is desired, for example 850-1050 MHz, a binary signal of (1, 1, 1, 1, 0, 1) may be generated. This binary signal indicates that the bias generators 40*a*, 40*b* are off and that a frequency corresponding with the frequency select signal communicated via the signal line 51*f* is selected. However, in this example, the differential amplifier 82 within the bias generator 40*c* has an increased gain and only the PMOS transistors 97*a-d* on. The IREF signals communicated via the signal lines 50*i-l* determine the delay time $\tau$ of the waveform generator 42*c*. An output waveform from the waveform generator 42*c* is communicated to the MUX 54 via the signal line 52*c*. The MUX 54 receives the binary signal and selects the output signal received via the signal line 52*c* as the PLL output signal, which communicated via the signal line 34.

Figure 6:
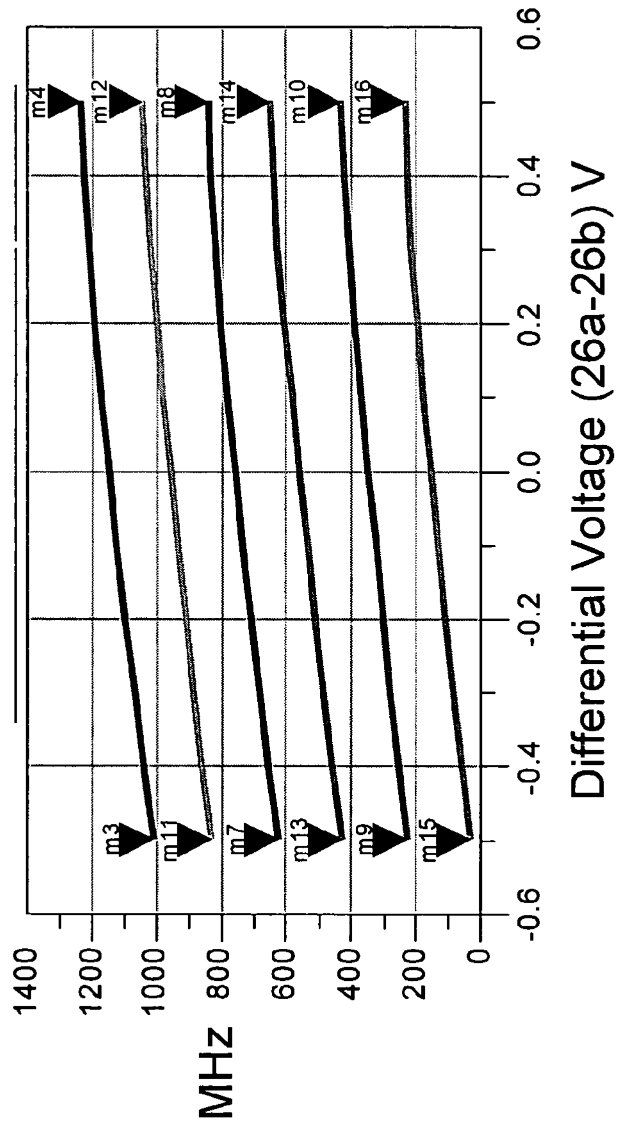
FIG. 6 is a graph illustrating stable gain of a VCO, such as the VCOs illustrated in FIGS. 2*a* and 2*b*.

FIG. 6 is a graph of frequency vs. input voltage in the above example. The PLL output signal for a given binary signal is demonstrated. The gain of the VCO ranges from approximately 200-225 MHz/V over a frequency range of 35-1235 MHz. This is a much reduced deviation in gain in comparison to the example illustrated in FIG. 1*a*.

As described above, various embodiments of VCOs 36, 37 (and other embodiments) may be designed to conform to a circuit designer's preferences. In a certain embodiments, the VCOs 36, 37 may be realized in an ASIC customized to perform specific functions for a particular use or uses. For many applications, embodiments of the invention may be implemented on a DSP (Digital Signal Processor) or FPGA (Field Programmable Gate Array) as well. Embodiments could also be implemented in software, such as in software phase locked loops. These loops implement a PLL using software equivalents for each of the circuit blocks. Such phase locked loops would typically be run on a DSP or microprocessor. Software PLLs are becoming more popular mainly due to the availability of cheap and easy to program DSPs.

As such, the above-described apparatus and methods may be embodied as software code, for example on a carrier medium such as a disk, CD- or DVD-ROM, programmed memory such as read only memory (Firmware), or on a data carrier such as an optical or electrical signal carrier. Thus the code may comprise conventional program code or micro-code or, for example code for setting up or controlling an ASIC or FPGA. The code may also comprise code for dynamically configuring re-configurable apparatus such as re-programmable logic gate arrays. Similarly the code may comprise code for a hardware description language such as Verilog or VHDL (Very high speed integrated circuit Hardware Description Language). As the skilled person will appreciate, the code may be distributed between a plurality of coupled components in communication with one another. Where appropriate, the embodiments may also be implemented using code running on a field-(re-)programmable analog array or similar device in order to configure analog hardware.

The above embodiments describe a VCO that includes a waveform generator and a bias generator with a frequency select input. The frequency select input allows the frequency range of the VCO to be extended while maintaining a stable gain. In various other embodiments, multiple bias and waveform generators may be used. The frequency select input may be distributed to each bias generator and used by a multiplexer to determine an appropriate output waveform. It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A voltage controlled oscillator (VCO), comprising:

a first bias generator coupled to receive a frequency select input signal and a control input signal, wherein, in operation, the first bias generator uses the frequency select input signal and the control input signal to generate an output bias signal of the first bias generator, wherein the control input signal is a differential voltage input signal and the first bias generator comprises a differential amplifier coupled to receive the differential voltage input signal, the differential amplifier having a gain input signal terminal coupled to receive the frequency select input signal; and a first waveform generator coupled to receive the output bias signal from the first bias generator, wherein the first waveform generator, in operation, produces an output waveform having a frequency that is determined by the output bias signal.

2. The VCO of claim 1, wherein the first bias generator further comprises a reference circuit coupled to the differential amplifier, wherein the reference circuit has a gain input signal terminal coupled to receive the frequency select input signal, the reference circuit producing the output bias signal.

3. The VCO of claim 2, wherein the first waveform generator comprises a plurality of delay cells coupled to receive the output bias signal of the first bias generator, a delay time of the delay cells being determined by the output bias signal of the first bias generator.

4. The VCO of claim 1, further comprising:

a second bias generator coupled to receive the frequency select input signal and the control input signal, wherein, in operation, the second bias generator uses the frequency select input signal and the control input signal to generate an output bias signal of the second bias generator;

a second waveform generator coupled to receive the output bias signal of the second bias generator, the second waveform generator, in operation, producing an output waveform having a frequency that is determined by the output bias signal of the second bias generator; and a logic circuit coupled to receive the output waveforms of the first and second waveform generators and the frequency select input signal, the frequency select input signal being used to select an output waveform of the logic circuit from the output waveforms of the first and second waveform generators.

5. The VCO of claim 4, wherein the frequency select input signal comprises a multi-bit signal, a first portion of the multi-bit signal being communicated to the first bias generator and a second portion of the multi-bit signal being communicated to the second bias generator.

6. The VCO of claim 4, further comprising a bias signal source coupled to the first and second bias generators, wherein the bias signal source provides a first reference bias signal for the first bias generator and a second reference bias signal for the second bias generator.

7. The VCO of claim 6, wherein the control input signal is a differential voltage input and the first and second bias generators each comprise a differential amplifier coupled to receive the differential voltage input signal, each differential amplifier having a gain input signal terminal coupled to receive the frequency select input signal.

8. The VCO of claim 7, wherein the first and second bias generators each further comprise a reference circuit coupled to the differential amplifier, the reference circuit comprising a gain input signal terminal coupled to receive the frequency select input signal, the reference circuit producing the output bias signals of the first and second bias generators.

9. A bias generator for use in a voltage controlled oscillator, comprising:

a reference circuit including a bias input signal terminal and a gain input signal terminal;

a differential amplifier having a gain input signal terminal and an output signal terminal, the output signal terminal being coupled to the bias input signal terminal of the reference circuit; and a first frequency select input signal terminal; and a logic circuit coupled with the first frequency select input signal terminal, the logic circuit including a first output signal terminal connected to the gain input signal terminal of the reference circuit and a second output signal terminal connected to the gain input signal terminal of the differential amplifier.

10. The bias generator of claim 9, wherein the differential amplifier further comprises:

first and second resistances having first and second terminals, wherein the second terminal of the first resistance is connected to the first terminal of the second resistance;

first and second field effect transistors (FET), a source of the first FET being coupled to the first terminal of the first resistance and a source of the second FET being coupled to the second terminal of the second resistance; and a third FET having a gate, a drain, and a source, the drain being coupled to the second terminal of the second resistance, the source being coupled to the first terminal of the second resistance, and the gate being coupled to the gain input signal terminal of the differential amplifier.

11. The bias generator of claim 9, wherein the reference circuit further comprises:

a first field effect transistor (FET) having a gate and a drain, wherein the gate is coupled to the bias input signal terminal of the reference circuit; and a second FET having a source and a gate, wherein the source is coupled to the drain of the first FET and the gate is coupled to the gain input signal terminal of the reference circuit.

12. The bias generator of claim 10, wherein the reference circuit further comprises:

a fourth FET having a gate and a drain, the gate of the fourth FET being coupled to the bias input signal terminal of the reference circuit; and a fifth FET having a source and a gate, the source of the fifth FET being connected to the drain of the fourth FET and the gate of the fifth FET being connected to the gain input signal terminal of the reference circuit.

13. The bias generator of claim 12, wherein the logic circuit further comprises an AND gate having first and second input terminals and an output terminal, the output terminal being coupled to the gain input signal terminal of the reference circuit and the first input terminal being coupled to the gain input signal terminal of the differential amplifier, the first input terminal being used to adjust a current through the third FET and the first and second inputs being used to adjust a current through the fourth FET.

14. The bias generator of claim 13, wherein the bias generator further comprises a second frequency select input signal terminal coupled to the logic circuit, the first frequency select input signal terminal being coupled to the first input terminal of the AND gate and the second frequency select input signal terminal being coupled to the second input terminal of the AND gate.

15. The bias generator of claim 14, wherein the logic circuit further comprises an OR gate having first and second input terminals and an output terminals, the first input terminal of the OR gate being coupled to the output terminal of the AND gate, the second input terminal of the OR gate being coupled to the second frequency select input signal terminal and the output terminal of the OR gate being coupled to a second gain input signal terminal of the reference circuit.

16. The bias generator of claim 15, wherein the reference circuit further comprises a fifth FET having a gate and a drain, the gate of the fifth FET being coupled to the bias input signal terminal of the reference circuit; and a sixth FET having a source and a gate, the source of the sixth FET being coupled to the drain of the fifth FET and the gate of the sixth FET being coupled to the second gain input signal terminal of the reference circuit.

17. The bias generator of claim 16, wherein first and second frequency select signals are used to turn the bias generator on and off.

18. A method of providing a stable frequency gain in a voltage controlled oscillator: the method comprising:

providing a voltage input signal and a frequency input signal to a differential amplifier within the voltage controlled oscillator;

providing an output signal of the differential amplifier to a reference circuit;

biasing a waveform generator with an output signal of the reference circuit;

adjusting a gain of the differential amplifier using the frequency input signal;

adjusting the frequency of an output waveform of the waveform generator using the frequency input signal;

providing the waveform output to a logic circuit; and using the logic circuit to select an output signal of the voltage controlled oscillator from a plurality of waveform generators.

19. The method of claim 18, further comprising:

providing the frequency input signal to the reference circuit; and adjusting the output signal of the reference circuit using the frequency input signal.

20. The method of claim 19, further comprising turning the reference circuit off using the frequency input signal.

* * * * *